United States Patent [19]

Hansson et al.

[11] Patent Number: 5,764,145
[45] Date of Patent: Jun. 9, 1998

[54] CAPACITIVE DETECTOR DEVICE AND ALARM SYSTEM

[76] Inventors: Goran Hansson, Gronstensvagen 13, S-752 41 Uppsala; Bo Lindgren, Ishavsvagen 1, S-136 49 Haninge; Tommy Soderberg, Teknikvagen 13, S-186 32 Vallentuna, all of Sweden

[21] Appl. No.: 637,740
[22] PCT Filed: Oct. 28, 1994
[86] PCT No.: PCT/SE94/01017
§ 371 Date: Jun. 27, 1996
§ 102(e) Date: Jun. 27, 1996
[87] PCT Pub. No.: WO95/12185
PCT Pub. Date: May 4, 1995

[30] Foreign Application Priority Data

Oct. 29, 1993 [SE] Sweden .................. 9303582

[51] Int. Cl.$^6$ ........................... G08B 13/26
[52] U.S. Cl. .............. 340/562; 340/567; 340/568; 340/571; 331/65
[58] Field of Search ................. 340/562, 568, 340/571, 567, 561; 331/65

[56] References Cited

U.S. PATENT DOCUMENTS

| | | |
|---|---|---|
| 3,760,402 | 9/1973 | Magerle et al. .................. 340/568 |
| 4,124,848 | 11/1978 | Clark et al. ..................... 340/524 |
| 4,144,529 | 3/1979 | Miller et al. . | 
| 4,325,058 | 4/1982 | Wagner et al. . |
| 4,621,258 | 11/1986 | Campman ..................... 340/562 |
| 4,987,402 | 1/1991 | Nykerk . |
| 5,406,261 | 4/1995 | Glenn ........................... 340/568 |

FOREIGN PATENT DOCUMENTS

| | | |
|---|---|---|
| 0334531 | 9/1989 | European Pat. Off. . |
| 2069206 | 8/1981 | United Kingdom . |
| 8707417 | 12/1987 | WIPO . |
| 8808595 | 11/1988 | WIPO . |
| 9424645 | 10/1994 | WIPO . |

*Primary Examiner*—Thomas Mullen
*Assistant Examiner*—Daniel J. Wu
*Attorney, Agent, or Firm*—Young & Thompson

[57] ABSTRACT

A capacitive detector is provided which includes an antenna for detecting small capacitive changes in an electric or electromagnetic field surrounding the antenna, and particularly to an alarm system which uses the capacitive detector to generate an alarm signal upon detection of capacitive changes in the generated electric or electromagnetic field. The detector is realized with an antenna connected to an electronic circuitry which generates an electric field around the antenna. The electronic circuitry generates an electric or electromagnetic field around the antenna, builds up a balanced electric field around the antenna, maintains the generated electric or electromagnetic field around the antenna balanced, prevents the detector device from being affected by changes in temperature and humidity, detects small changes in the generated electric field around the antenna, and indicates that a change in the generated electric field has occurred.

20 Claims, 3 Drawing Sheets

CAPACITIVE DETECTOR DEVICE AND ALARM SYSTEM

BACKGROUND OF THE INVENTION

1. Field of the Invention

This invention relates to a capacitive detector with an antenna for detecting small capacitive changes in an electric or electromagnetic field surrounding the antenna, and particularly to an alarm system which uses the capacitive detector to generate an alarm signal upon detection of capacitive changes in the generated electric or electromagnetic field.

2. Description of the Prior Art

The method of measuring changes in an electric or electromagnetic field in order to detect intruders is widely used in different kind of alarm systems. The object of such alarm systems is to protect an area from intruders or an object from being removed or stolen. These alarms typically give some kind of a first warning when a change in the electric or electromagnetic field occurs, i.e. they act to prevent the intruder from even getting close to the object or area being protected. However, these systems have many disadvantages that often trigger false alarms. Some of the disadvantages are:

1) The use of an oscillator which operates at high frequencies often in the RF range. The problem with high frequencies is that they do not meet the requirements in the legislation concerning EMC (Electro Magnetic Compatibility), i.e. they interfere with other electronic equipment such as mobile telephones, TV and radio.
2) Sensitivity to changes in humidity which can trigger false alarms if the detector or sensor is set to detect small changes.
3) Difficulty in defining a balanced field surrounding the antenna, due to different conductive objects in the proximity to the antenna that distort the propagation of the detector field in space.
4) Drifting of various electronic elements and circuits due to changes in temperature which will affect the detecting accuracy.

WO 88/08595 discloses a capacitance proximity sensor which uses a conducting foil as a sensing electrode. The conducting foil is connected to an electronic circuitry. The electronic means comprises an inductive coil which together with the configuration of the conducting foil controls the frequency of an oscillator, typical 80 kHz. The presence of an intruder in the field changes the capacitance of conducting foil and alters the oscillator frequency. This frequency change is used to detect a capacitive change. This capacitance proximity sensor operates with a frequency of 80 kHz which results in one of the above mentioned problems, i.e. it will not meet the EMC requirements.

U.S. Pat. No. 4,987,402 discloses a alarm system which uses a proximity detector to detect an intrusion into an adjustable electromagnetic field set up around the object to be protected. This electromagnetic field is a RF field which results in the above mentioned problem.

EP 0 334 531 discloses a proximity detector made up of conductive paint and with a capacitor and switching means that form a an oscillator having a frequency of from 1 to 150 kHz. This detector measures the frequency change when an intruder enters the field. This detector, since using paint as an electrode, is directed toward surveillance of rooms or doorways and its application has therefore a very narrow range.

Thus, there is demand for a capacitive detector meeting the EMC requirements and which in a reliable way is capable of detecting small capacitive changes without being influenced by changes in temperature and humidity.

SUMMARY OF THE INVENTION

The object of the present invention is to provide a capacitive detector meeting the EMC requirements and being capable of generating a balanced field surrounding the antenna and which is not affected by changes in humidity and temperature in order to detect small capacitive changes in the generated field surrounding the antenna.

The detector is realized with an antenna connected to an electronic circuitry which generates an electric field around the antenna. The electronic circuitry comprises, generating means for generating an electric or electromagnetic field around said antenna, adjustable means for building up a balanced electric field around the antenna, balancing means for maintaining the generated electric or electromagnetic field around said antenna balanced, filtering means which prevents the detector device from being affected by changes in temperature and humidity, detection means which detects small changes in the generated electric field around said antenna, and indicating means which indicates that a change in the generated electric field has occurred.

One preferred embodiment of the capacitive detector comprises an alarm system capable of generating different alarm signals depending on how close the intruder is to the object being protected.

BRIEF DESCRIPTION OF THE DRAWINGS

The above and other features and advantages of the present invention will become apparent from the following detailed description of the preferred embodiments, given by a way of example, taken in conjunction with the accompanying drawings in which.

DESCRIPTION OF THE PREFERRED EMBODIMENTS

Figure 1:
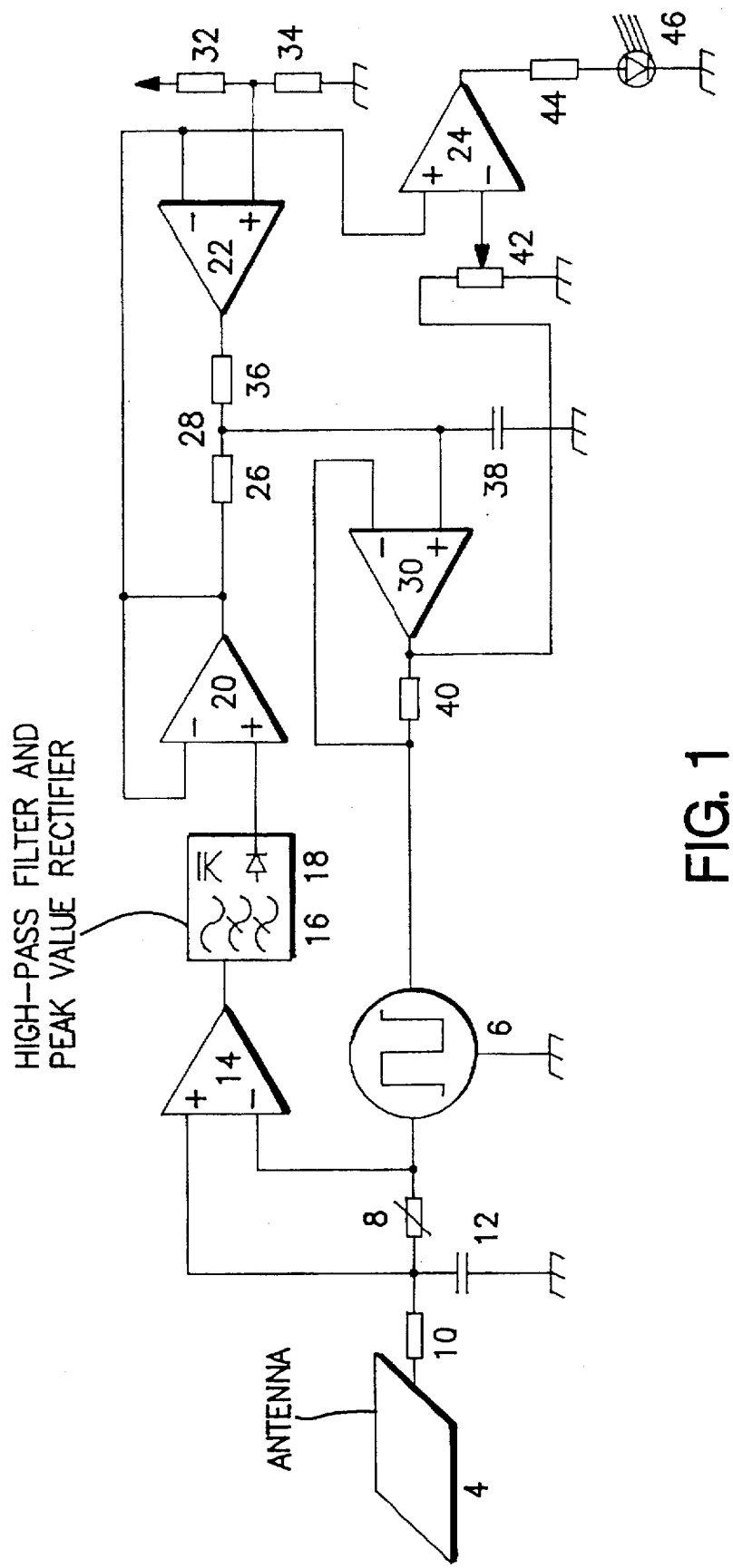
FIG. 1 Is a circuit diagram of a first embodiment having an analog capacitive detector circuitry according to the present invention.

FIG. 1 shows an electronic circuitry 2 and an antenna 4 that constitute one preferred embodiment of the capacitive detector according to the present invention.

The electronic circuitry 2 has a square wave generator 6 which has one output terminal connected to ground and the other output terminal connected to an adjustable resistor 8. This other output terminal is also connected to the negative input of an operational amplifier 14. The other end of the adjustable resistor is connected to a low-pass filter comprising a resistor 10 and a capacitor 12 and to the positive input of the operational amplifier 14. The capacitor 12 of the low-pass filter is connected to ground and the resistor 10 is connected to the antenna 4. The output of the operational amplifier 14 is connected via a high-pass filter 16 and a peak value rectifier 18 to the positive input of an operational amplifier serving as a voltage follower 20. The output of the voltage follower 20 is used as feedback to the negative input thereof. The output of the voltage follower 20 is also connected to the negative input of a comparator 22, to the positive input of a comparator 24 and via a resistor 26 and a summation node 28 to the positive input of a voltage follower 30. The positive input of the comparator 22 is supplied by a reference voltage from a voltage divider comprising to resistors 32 and 34. Resistor 32 is connected to a positive supply voltage and the resistor 34 is connected to ground. The output of the comparator 22 is via resistor 36 and the summation node 28 connected to the positive input of the voltage follower 30. The summation node 28 is connected to ground via a capacitor 38. The output of the voltage follower 30 is via a resistor 40 used as feedback to the negative input thereof. This output is also used via the resistor 40 as an input to the square wave generator 6 which thereby closes the loop. The direct output of the voltage follower 30 is via a potentiometer 42 used as a negative input to the comparator 24. The output of the comparator 24 is via a resistor 44 connected to a light emitting diode 46, LED, which is connected to ground.

Thus, the physical constitution of the capacitive detector has been described and the description will now be directed toward the function of the different elements in the electronic circuitry 2 constituting the capacitive detector.

The configuration of the antenna 4 can be varied in numerous different ways depending on the application of the capacitive detector. One example will be given below in conjunction with the description of an alarm system comprising the present invention.

The square wave generator 6, the output level of which is adjustable, generates a square wave, 50–5000 Hz, which is applied to the antenna 4 via the adjustable resistor 8 and the low-pass filter 10, 12. The applied square wave generates an electrical field around the antenna 4. The capacitive load caused by the surrounding ground structure on the antenna 4 is typically around 50–500 pF.

The object of the adjustable resistor 8 is to interface the square wave to the conditions given by the specific surroundings in order to establish a balanced operating point at the output of the voltage follower 20. This balanced operating point is used as reference in comparison with quick changes in the electric field, which will trigger the LED 46. The adjustable resistor 8 is initially set such that the operating point at the output of the voltage follower 20 is equal to the reference voltage applied to the comparator 20 by the voltage divider 32, 34. The adjustable resistor 8 could also be realized as a digitally controlled resistor if the capacitive detector is to be realized in a microcomputer architecture, which will be described below.

The low-pass filter 10, 12 is used to stabilize and balance the electric field generated around the antenna 4 and to prevent RF signals from being input to the electric circuitry 2, which otherwise could cause interference. As an option an inductor (not shown) could be connected in series with the resistor 10 if that is required to stabilize and balance the electric field around the antenna 4.

The operational amplifier 14, which on its negative input is supplied with the square wave generated by the square wave generator 6 and on its positive input is supplied with the square wave affected by the capacitive load on the antenna 4, amplifies the difference thereof.

The operational amplifier 14 works with a gain around 300 000, i.e open loop gain. This is necessary in order to detect small changes in the generated capacitive field. The operational amplifier 14 has among other parameters the Common Voltage Mode Range, CVMR. The CVMR defines the +/− operating range within which the input signal has to be in order to be linearly amplified. If the input signal is outside this CVMR the operational amplifier 14 is blocked and the output will either go high or low. By balancing the variable high level of the generated square wave such that it precisely is kept within the CVMR the unnecessary parts of the signal is blocked away and thus only a small portion of the square wave gets amplified. This portion has the greatest sensitivity regarding capacitive influence. The capacitive influence on the signal coming from the antenna 4 has the typical charge an discharge curve. The differential measurement performed by the operational amplifier 14 measures the difference between the unaffected square wave and the by the antenna capacitive affected square wave. Since the component values in the electronic circuitry are very important for balancing the operational amplifier 14 correct they are listed in a separate component list following the description.

The high-pass filter 16 is used to filter DC components. This is done to eliminate the effect of temperature and humidity changes that may affect the accuracy of the capacitive measurement.

The voltage follower 22 is used to separate the detector part of the circuitry 2 from the subsequent circuits. This is done to limit the influence of the subsequent circuits on the peak value rectifier 18. The voltage follower 30 is also used to limit the influence of the subsequent circuits thereof on the capacitor 38 and resistors 26 and 36.

The comparator 22 is used to stabilize and balance the square wave generator 6. The voltage divider 32, 34 supplies the comparator 22 with the reference voltage, which is to be compared with the output of the voltage follower 20. The output of the comparator 22 generates a reverse polarity compared to changes in the voltage follower 20 output. The capacitor 38 is provided to prevent oscillation of the comparator 22, i.e. the regulation will be attenuated by a time constant R*C, where C is the value of capacitor 38 and R is the value of the resistor 36.

The comparator 24 is us ed to detect changes in the generated electric field surrounding the antenna 4. These capacitive changes typically have a value of 2–10 pF when a human body enters the electric field. The positive input of the comparator 24 is the output from the voltage follower 20. Under normal circumstances, i.e. when no changes in the electric field occur, this positive input corresponds to the reference voltage. The negative input of the comparator 24 is supplied via potentiometer 42 from the output of the voltage follower 30, which also corresponds to the reference voltage. The potentiometer 42 is used to set the level at which the capacitive detector shall indicate that there has been a change in the electric field, for instance when an intruder gets closer to the antenna 4 than a predetermined distance. To indicate that this has happened the comparator 24 output goes high which activates the LED.

Thus the principles of the capacitive detector have been described. The described embodiment is made up of analog circuits, but could of course by those skilled in the art be realized with a microcomputer based architecture or other architectures without departing from the scope of the invention.

Figure 2:
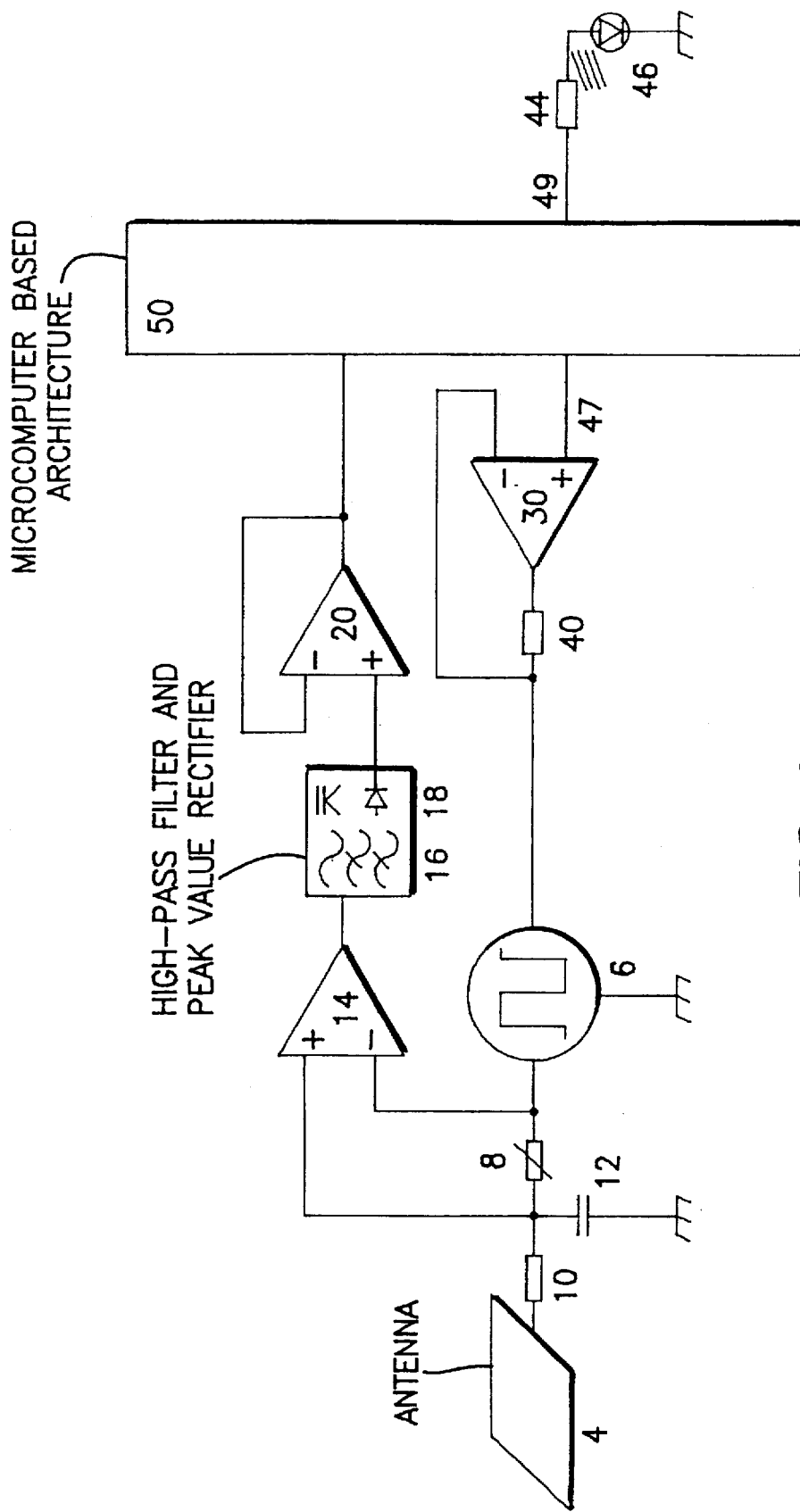
FIG. 2 is a circuit diagram of a second embodiment having a partly microprocessor capacitive detector based architecture according to the present invention.

FIG. 2 shows a second embodiment of the capacitive detector which partly uses a microcomputer based architecture. It will function correspondingly to the capacitive detector described in FIG. 1 and will therefore not be described again. One advantage with this second embodiment is that the output indicating a change in the electric field around the antenna 4 can be divided up in several different levels. Thus the presence of an intruder can be divided into several zones of presence, for example a first zone indicating that an intruder is entering the electric field of the antenna 4 which could be indicated by a LED, a second zone indicating that the intruder can reach the antenna 4 which could be indicated with a summer and a third zone indicating that the intruder almost makes contact with the antenna 4 which could be indicated by an alarm.

Figure 3:
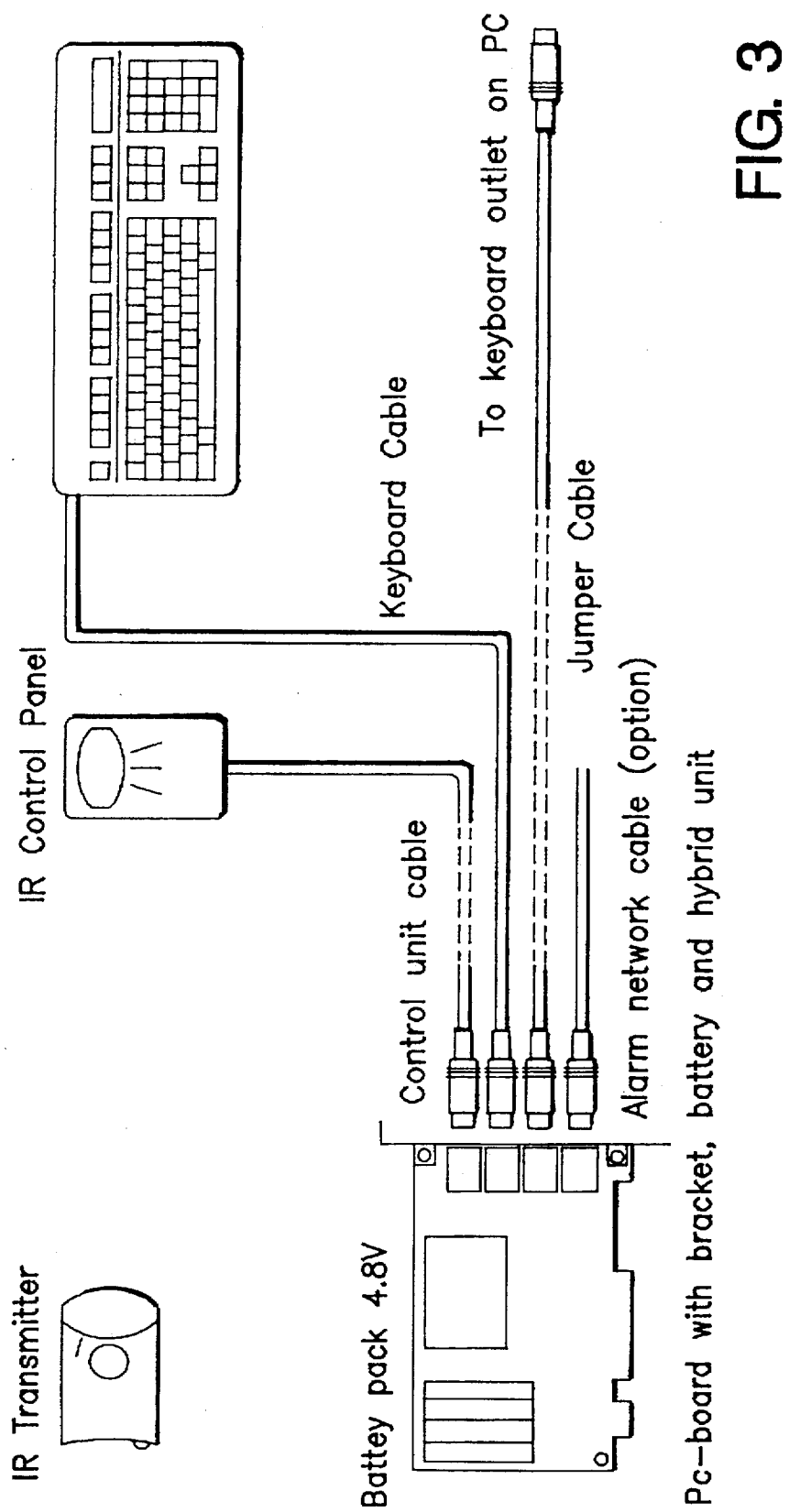
FIG. 3 is a view showing the capacitive detector embedded in an alarm system which protects a computer and uses the keyboard as an antenna.

FIG. 3 shows an embodiment in which the capacitive detector is used in an alarm system for protecting a computer from theft or being tampered with. In this embodiment the capacitive detector is arranged inside the computer chassis to prevent manipulation thereof by an intruder. The keyboard connected to the computer is used as an antenna. The connection between the computer and the keyboard is disconnected when the alarm is activated and the keyboard cable is used to apply the square wave generated by the square wave generator to the antenna (keyboard). The disconnection between the keyboard and the computer facilitates not only the supply of the square wave to the antenna but also prevents an intruder from using the computer since the keyboard is disabled.

The capacitive detector used in this embodiment is of the kind described in FIG. 2, i.e with a partly microcomputer based architecture, which enables the alarm system to operate with several zones of presence. The ranges that define the different presence zones are realized by software, which is within the competence of those skilled in the art.

The alarm system operates with different presence zones, each of which trigger different indicating means as an intruder enters the specific zone. The first zone of presence in this alarm system indicates that the intruder has come as close as for example 100–150 cm to the antenna. This change in the electric field will be indicated by a first LED that warns the intruder that he is within a protected area. A second zone of presence indicates that the intruder has come as close as for example 30 cm to the antenna which gives the intruder a change to reach out and touch the antenna. This is indicated by a second LED and a summer that gives a second warning to the intruder that he is within the protected area. Finally a third zone of presence indicates that the intruder almost makes contact with the antenna 4. This is indicated by a third LED and a siren that generates a very high noise making it impossible for the intruder to stay in the protected area. This third warning could of course also be connected to an alarm surveillance central.

Furthermore this alarm system has the advantage that it is very difficult to manipulate. If one tries to disconnect the keyboard the capacitive detector which is balanced with the keyboard functioning as an antenna will get unbalanced and thus triggers an alarm. The same will happen if the power supply cable to the computer is disconnected, since the capacitive detector will loose its reference to ground.

The alarm system described above illustrates a specific application for the capacitive detector of the present invention. But it should be noted that the capacitive detector can be used in numerous other applications without departing from the scope of the invention. Those skilled in the art can readily change the configuration of the antenna such that it suits the needs of a specific application. If the capacitive detector for example is to be used for detecting changes in an electric field around a painting the antenna could be configured as a thin grid printed on a layer of plastic. The antenna would then be placed behind the painting.

Although presently preferred embodiments of the invention have been described, it will be apparent from the description to those skilled in the field to which the invention pertains, that variations of the present embodiments may be implemented without departing from the principles of the invention.

Accordingly, it is intended that the invention be limited not by the structural or functional elements described in the embodiment, but only as set out in the appended claims.

| COMPONENT LIST | |
|---|---|
| Reference number | Component (value) |
| 8 | 0–10 kΩ |
| 10 | 3,3 kΩ |
| 12 | 47 pF |
| 14 | CA 3160 E |
| 20 | TL 074 |
| 22 | LM 339 |
| 24 | LM 339 |
| 26 | 1 MΩ |
| 30 | TL 074 |
| 33 | 2,84 volt |
| 36 | 1 MΩ |
| 38 | 100 μF |
| 40 | 200 Ω |

We claim:

1. A detector device (2) connected to an antenna (4) for detecting small capacitive changes in an electric or electromagnetic field around said antenna (4), said device comprising, generating means (6) for generating an electric or electromagnetic field around said antenna (4), balancing means (8, 10, 12) for building up a balanced electric or electromagnetic field around said antenna (4).

filtering means (16, 18) to prevent the detector device from being affected by changes in temperature and humidity, characterized in that said generating means (6) is a square wave generator, and in that the unaffected square wave from said generator (6) and the square wave capacitively affected by the field surrounding the antenna (4) are fed to amplifier means (14) to amplify the difference thereof.

2. Detector device (2) according to claim 1, wherein said amplifier means (14) comprises an operational amplifier (14), operating with an open loop gain and is balanced to work within the common voltage mode range.

3. Detector device (2) according to claim 2, wherein said balancing means comprises a low-pass filter (10, 12) connected between adjustable means (8), and said antenna (4) in order to prevent high frequency signals to be input to the detector device (2) and to stabilize and balance the electric or electromagnetic field around said antenna (4).

4. Detector device (2) according to claim 2, further including stabilizing means (22) for stabilizing the output voltage of said square wave generator (6) comprising a comparator (22) which negative input is connected via said filtering means (16) to the output of said operational amplifier (14) and which positive input is connected to a voltage divider (32, 34) supplying a reference voltage.

5. Detector device (2) according to claim 4, wherein said comparators (22) and (24) are realized by a microcomputer architecture.

6. Detector device (2) according to claim 4, wherein said filtering means comprises a high-pass filter (16), a peak value rectifier (18) and a voltage follower (20) connected in series, the output of which is connected to the negative input of said comparator (22), to the positive input of a comparator

(24) and to the positive input of a voltage follower (30), and wherein the output of said operational amplifier (14) is fed to the input of said high-pass filter (16) of said filtering means is.

7. Detector device (2) according to claim 1, wherein said balancing means comprises a low-pass filter (10, 12) connected between adjustable means (8), and said antenna (4) in order to prevent high frequency signals to be input to the detector device (2) and to stabilize and balance the electric or electromagnetic field around said antenna (4).

8. Detector device (2) according to claim 7, further including stabilizing means (22) for stabilizing the output voltage of said square wave generator (6) comprising a comparator (22) which negative input is connected via said filtering means (16) to the output of said operational amplifier (14) and which positive input is connected to a voltage divider (32, 34) supplying a reference voltage.

9. Detector device (2) according to claim 7, wherein the square wave generator (6) is connected to the negative input of said operational amplifier (14) and to said adjustable means (8).

10. Detector device (2) according to claim 9, further including stabilizing means (22) for stabilizing the output voltage of said square wave generator (6) comprising a comparator (22) which negative input is connected via said filtering means (16) to the output of said operational amplifier (14) and which positive input is connected to a voltage divider (32, 34) supplying a reference voltage.

11. Detector device (2) according to claim 9, wherein said filtering means comprises a high-pass filter (16), a peak value rectifier (18) and a voltage follower (20) connected in series, the output of which is connected to the negative input of said comparator (22), to the positive input of a comparator (24) and to the positive input of a voltage follower (30), and wherein the output of said operational amplifier (14) is fed to the input of said high-pass filter (16) of said filtering means.

12. Detector device (2) according to claim 11, wherein said comparators (22) and (24) are realized by a microcomputer architecture.

13. An alarm system for surveillance of an object located within an electric or electromagnetic field surrounding said object, said alarm system comprising, an antenna (4) for sensing small capacitive changes in said electric or electromagnetic field, a detector device (2) connected to said antenna (4) for detecting small capacitive chances in the generated electric or electromagnetic field, said detector device comprising, generating means (6) for generating an electric or electromagnetic field around said antenna (4), balancing means (8, 10, 12) for building up a balanced electric or electromagnetic field around said antenna (4), filtering means (16, 18) to prevent the detector device from being affected by chances in temperature and humidity, said generating means (6) being a square wave generator, the unaffected square wave from said generator means (6) and the square wave capacitively affected by the field surrounding the antenna (4) being fed to amplifier means (14) to amplify the difference thereof, and defining means for defining at least one level of protection.

14. Alarm system according to claim 13 for protecting a computer, wherein elements of the keyboard of the computer are used as the antenna (4).

15. Alarm system according to claim 13 for protecting a painting, wherein said antenna (4) is realized by a thin grid printed on a layer of plastic and placed behind the painting.

16. Alarm system according to claim 15 for protecting a computer, wherein elements of the keyboard of the computer are used as the antenna (4).

17. Alarm system according to claim 13, wherein said defining means comprises a microcomputer defining three levels of presence for an intruder depending on the value of the difference between the detected voltage and a reference voltage, namely a first zone of presence which indicates that the intruder has come as close as a first distance to the object being protected, a second zone of presence which indicates that the intruder has come as close as a second distance to the object being protected, said second distance being less than said first distance, and a third zone of presence which indicates that the intruder almost makes contact with the object being protected.

18. Alarm system according to claim 17 for protecting a painting, wherein said antenna (4) is realized by a thin grid printed on a layer of plastic and placed behind the painting.

19. Alarm system according to claim 17, comprising a first light emitting diode indicating that the intruder has entered the first zone of presence, a second light emitting diode and a summer indicating that the intruder has entered the second zone of presence and a third light emitting diode and a siren indicating that the intruder has entered the third zone of presence.

20. Alarm system according to claim 19 for protecting a painting, wherein said antenna (4) is realized by a thin grid printed on a layer of plastic and placed behind the painting.

* * * * *

UNITED STATES PATENT AND TRADEMARK OFFICE
Certificate

Patent No. 5,764,145                                                                         Patented: June 9, 1998

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Goran Hansson, Gronstensvagen 10, 75241 Uppsala, Sweden, Bo Lindgren c/o Hjelm Ostgotagatan 70, 16 64 Stockholm, Sweden; Tommy Soderberg, Vintrosagatan 14, 124 77 Bandhagen, Sweden; Stig Norberg, Andebodavagen 325, 175 43 Jarfalla, Sweden.

Signed and Sealed this Eighteenth Day of July, 2000.

JEFFREY A. HOFSASS
*Supervisory Patent Examiner*
Art Unit 2736